United States Patent
Xiao

(10) Patent No.: US 9,859,897 B2
(45) Date of Patent: Jan. 2, 2018

(54) METHODS AND APPARATUS FOR CONFIGURING AND RECONFIGURING A PARTIAL RECONFIGURATION REGION

(71) Applicant: Altera Corporation, San Jose, CA (US)

(72) Inventor: Ping Xiao, East Palo Alto, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 15/220,216

(22) Filed: Jul. 26, 2016

(65) Prior Publication Data

US 2016/0352338 A1     Dec. 1, 2016

Related U.S. Application Data

(63) Continuation of application No. 14/723,876, filed on May 28, 2015, now Pat. No. 9,425,802.

(51) Int. Cl.
*H03K 19/177* (2006.01)
*H03K 19/00* (2006.01)

(52) U.S. Cl.
CPC ... *H03K 19/17756* (2013.01); *H03K 19/0008* (2013.01); *H03K 19/1776* (2013.01); *H03K 19/17728* (2013.01); *H03K 19/17744* (2013.01); *H03K 19/17776* (2013.01)

(58) Field of Classification Search
None
See application file for complete search history.

(56) References Cited

U.S. PATENT DOCUMENTS

| | | | |
|---|---|---|---|
| 4,852,095 A * | 7/1989 | Meltzer | G06F 11/0727 714/34 |
| 6,046,603 A | 4/2000 | New | |
| 6,148,390 A * | 11/2000 | MacArthur | H03K 19/17728 365/201 |
| 6,191,613 B1 | 2/2001 | Schultz et al. | |
| 6,255,849 B1 | 7/2001 | Mohan | |
| 6,842,039 B1 | 1/2005 | Guzman et al. | |
| 7,064,577 B1 * | 6/2006 | Lee | G06F 17/5054 326/38 |
| 7,085,858 B1 | 8/2006 | Fox et al. | |
| 7,112,992 B1 | 9/2006 | Guzman et al. | |
| 7,268,582 B1 | 9/2007 | Zheng et al. | |
| 7,330,912 B1 | 2/2008 | Fox et al. | |
| 7,477,072 B1 | 1/2009 | Kao et al. | |
| 7,652,498 B2 | 1/2010 | Hutchings et al. | |

(Continued)

*Primary Examiner* — Vibol Tan
(74) *Attorney, Agent, or Firm* — Jason Tsai

(57) ABSTRACT

An integrated circuit for configuring and reconfiguring a configuration shift register (CSR) partial reconfiguration region is disclosed. The integrated circuit includes a CSR chain that is partitioned into a group of CSR partial reconfiguration regions. A multiplexer circuit is added to the end of each PR region to allow the PR region to be bypassed or connected to the next PR region. Each PR region is connected to a PR circuit that facilitates the CSR configuration of the respective PR region. The PR circuit includes region enable circuitry and region control circuitry. Region enable circuitry enables the configuration of the CSR PR region. Region control circuitry generates local reconfiguration control signals to control the configuration operation of the enabled CSR PR region.

18 Claims, 9 Drawing Sheets

(56) References Cited

U.S. PATENT DOCUMENTS

| | | | |
|---|---|---|---|
| 7,747,423 B1 | 6/2010 | Shirazi et al. | |
| 7,852,705 B1 * | 12/2010 | Le | G06F 12/0646 |
| | | | 365/230.02 |
| 8,415,974 B1 * | 4/2013 | Lysaght | H03K 19/17752 |
| | | | 326/39 |
| 8,539,011 B1 | 9/2013 | Taylor | |
| 8,664,975 B1 * | 3/2014 | Gao | G06F 17/5054 |
| | | | 326/38 |
| 9,438,244 B2 * | 9/2016 | Sood | H03K 19/17784 |
| 9,543,956 B2 * | 1/2017 | Hooi | H03K 19/177 |
| 9,584,130 B1 * | 2/2017 | Weber | H03K 19/17756 |
| 9,588,176 B1 * | 3/2017 | Hutton | G11C 29/32 |
| 9,590,635 B1 * | 3/2017 | Sengupta | H03K 19/17756 |
| 2010/0052780 A1 | 3/2010 | Summerfield et al. | |
| 2014/0240000 A1 | 8/2014 | Tan et al. | |

\* cited by examiner

METHODS AND APPARATUS FOR CONFIGURING AND RECONFIGURING A PARTIAL RECONFIGURATION REGION

This application is a continuation of U.S. patent application Ser. No. 14/723,876, filed May 28, 2015, which is hereby incorporated by reference herein in its entirety. This application claims the benefit of and claims priority to U.S. patent application Ser. No. 14/723,876, filed May 28, 2015.

BACKGROUND

Reconfigurable integrated circuit devices, such as programmable logic devices (PLDs), are often included in complex embedded systems. A PLD is typically composed of a number of logic elements, sometimes referred to as logic array blocks (LABs) or configurable logic blocks (CLBs), which are sometimes referred to as logic elements. Such logic elements may include a look-up table (LUT) or product term, carry-out chain, register, and other elements. Multiple logic elements or LABs may be connected to horizontal and vertical conductors that may extend the length of the PLD's core logic region and connect to input-output (IO) and peripheral blocks.

With increasing device capacity and complexity, partial reconfiguration has become an important feature in PLDs. Such feature is driven by the need to shorten the configuration time to more quickly bring up a PLD, as well as the need to reconfigure the PLD on the fly to reduce or eliminate system downtime. Generally, a PLD configuration may include core logic configuration and IO configuration. Generally, IO configuration is different from core logic configuration, due to the variance in configuration elements and structures. For example, IO configuration may include a group of serially-connected configuration shift registers (collectively referred to as a configuration shift register chain). However, the configuration shift registers can only be fully configured in a regular full device configuration or reconfiguration (e.g., configured in the same way as the core logic region of the PLD). Reconfiguring any part of the configuration shift registers may thus require the PLD to be powered down (or otherwise deactivated or suspended). As a result, the configuration of the PLD may need to be restarted from the beginning each time, which is laborious and time-consuming.

SUMMARY

In accordance with the present invention, apparatuses and methods are provided for configuring and reconfiguring a partial reconfiguration region of an integrated circuit.

It is appreciated that the present invention can be implemented in numerous ways, such as a process, an apparatus, a system, or a device. Several inventive embodiments of the present invention are described below.

An integrated circuit is disclosed. The integrated circuit includes a group of configuration registers that are connected serially to form a configuration shift register (CSR). A group of CSRs may be partitioned into a predetermined number of CSR partial reconfiguration regions, with each CSR partial reconfiguration region being connected to a partial reconfiguration (PR) circuit. Each PR circuit includes region enable circuitry and region control circuitry. The region enable circuitry may receive PR circuit enable data and selectively enable reconfiguration of the CSR partial reconfiguration region connected to the PR circuit based on the PR circuit enable data. Accordingly, the region control circuitry may receive global configuration control signals and generate local reconfiguration control signals that selectively enable CSR data when the reconfiguration of the CSR partial reconfiguration region is enabled by the region enable circuitry. The generated local reconfiguration control signals may be used to selectively enable CSR data to be written into the CSR partial reconfiguration region when the reconfiguration of the CSR partial reconfiguration region is enabled.

A method of configuring an integrated circuit is also disclosed. The method includes receiving an input-output (IO) signal with a configuration shift register (CSR) partial reconfiguration region. Prior to receiving the IO signal, configuration data is received using a partial reconfiguration (PR) circuit to determine a state of the CSR partial reconfiguration region based on the configuration data. The state of the CSR partial reconfiguration region is determined by determining whether a configuration data portion of the PR region is present in the configuration data. Subsequently, the PR circuit may selectively enable a signal shifting function that uses the IO signal based on the state of the partial reconfiguration circuit. The signal shifting function selectively enables the CSR partial reconfiguration region.

A method of reconfiguring a configuration shift register (CSR) partial reconfiguration region of an integrated circuit is disclosed. The method includes receiving configuration data with a partial reconfiguration (PR circuit) that is connected to the CSR partial reconfiguration region. The PR circuit may receive global configuration control signals. The PR circuit may determine whether the CSR partial reconfiguration circuit is enabled by determining whether a configuration data portion of the CSR partial reconfiguration region is present in the input configuration data. When the configuration data portion of the partial reconfiguration circuit is present in the configuration data, the PR circuit may generate local reconfiguration control signals based on the configuration data portion to facilitate the reconfiguration of the CSR partial reconfiguration region.

Further features of the invention, its nature and various advantages, will be more apparent from the accompanying drawings and the following detailed description of the preferred embodiments.

DETAILED DESCRIPTION

The embodiments provided herein include integrated circuit structures and methods for configuring and reconfiguring a partial reconfiguration region of an integrated circuit.

It will be obvious, however, to one skilled in the art, that the present exemplary embodiments may be practiced without some or all of these specific details. In other instances, well-known operations have not been described in detail in order not to obscure unnecessarily the present embodiments.

Figure 1:
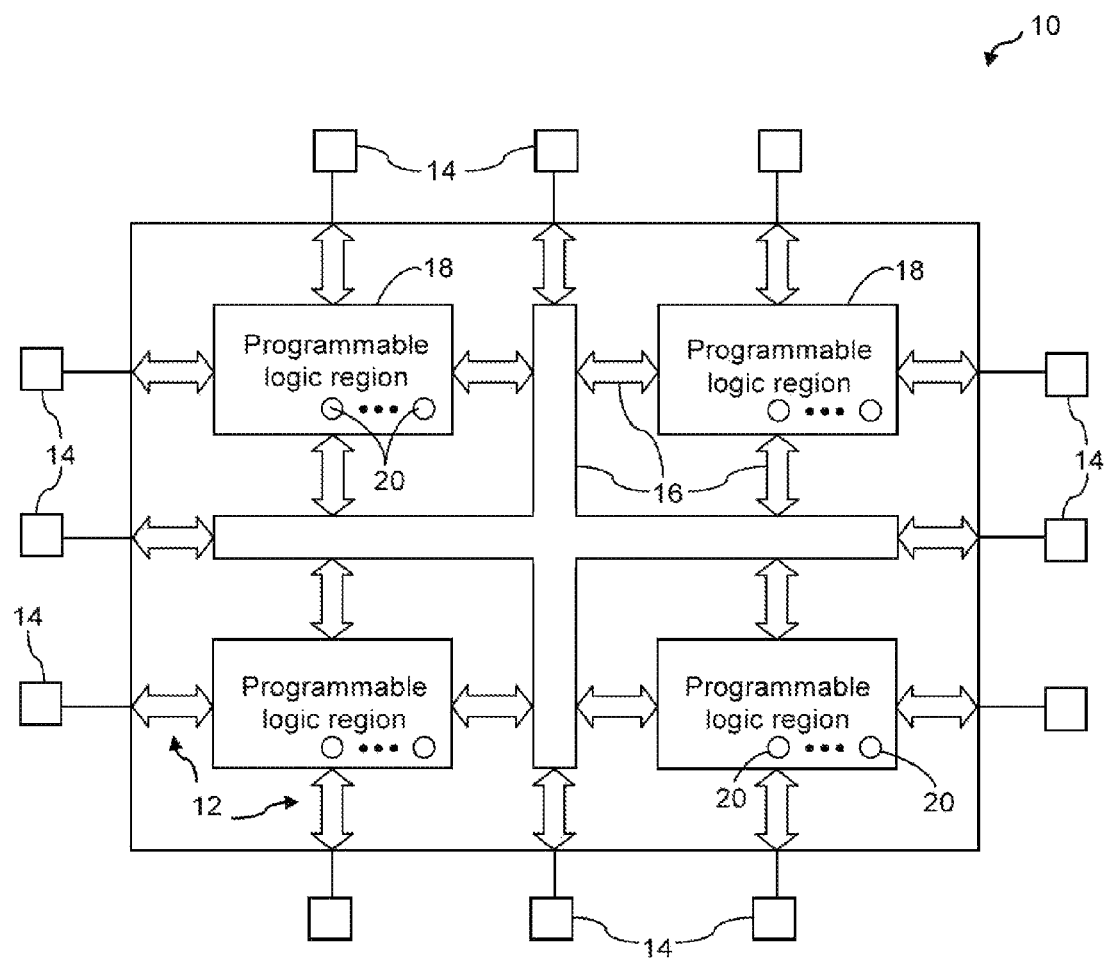
FIG. 1 is a diagram of an illustrative programmable integrated circuit in accordance with an embodiment of the present invention.

FIG. 1 is a diagram of an illustrative integrated circuit 10 in accordance with an embodiment of the present invention. Integrated circuit 10 has input-output (IO) circuitry 12 for driving signals off of integrated circuit 10 and for receiving signals from other circuits or devices via IO pins 14. Interconnection resources 16 such as global and local vertical and horizontal conductive lines and busses may be used to route signals on integrated circuit 10. Interconnection resources 16 include fixed interconnects (conductive lines) and programmable interconnects (e.g., programmable connections between respective fixed interconnects). The programmable interconnects associated with interconnection resources 16 may be considered to be a part of programmable logic regions 18.

Memory elements 20 may be formed using complementary metal-oxide-semiconductor (CMOS) integrated circuit technology (as an example). In the context of programmable logic device, memory elements 20 may store configuration data and are therefore sometimes referred to as configuration random-access memory (CRAM) cells. In general, configuration random-access memory elements 20 may be arranged in an array pattern. In a programmable logic device, there may be millions of memory elements 20 on a single device. A user (e.g., a logic designer) may provide configuration data for the array of memory elements during programming operation. Once loaded with configuration data, memory elements 20 may selectively control (e.g., turn on and off) portions of the circuitry in programmable logic regions 18 and thereby customize its functions as desired.

The circuitry of integrated circuit 10 may be organized using any suitable architecture. For example, programmable logic regions 18 may be organized in a series of rows and columns of larger programmable logic regions each of which contains multiple smaller regions. The larger regions are sometimes referred to as logic array blocks. The smaller logic regions are sometimes referred to as logic elements. A typical logic element may contain a look-up table, registers, and programmable multiplexers. If desired, programmable logic regions 18 may be arranged in more levels or layers in which multiple large regions are interconnected to form still larger portions of logic.

Horizontal and vertical conductors and associated control circuitry may be used to access memory elements 20 when memory elements 20 are arranged in an array. The control circuitry, for example, may be used to clear all or some of the memory elements. The control circuitry may also write data to memory elements 20 and may read data from memory elements 20. Memory elements 20 may be loaded with configuration data, for instance, in CRAM arrays. The loaded configuration data may then be read out from the memory array to confirm proper data capture before integrated circuit 10 is used during normal operation in a system.

In addition to the relatively large blocks of programmable logic regions that are shown in FIG. 1, integrated circuit 10 generally also includes some programmable logic components associated with IO circuitry 12 on integrated circuit 10. For example, IO circuitry 12 may contain serially-coupled configuration shift registers (CSRs), which are collectively referred to as a CSR chain, for carrying out IO and peripheral operations control in integrated circuit 10 based on received IO configuration information. However, the CSR chain can only be fully configured in a regular full configuration or reconfiguration (e.g., configured in the same way as the core logic region of integrated circuit 10). Reconfiguring any part of the CSR chain requires integrated circuit 10 to be powered down (or otherwise deactivated or placed in a suspended state). As a result, the configuration of integrated circuit 10 needs to be restarted from the beginning each time, which is laborious and time-consuming.

A flexible CSR configuration mechanism is required to perform circuit operations that support both full and partial CSR configurations during both device configuration and reconfiguration and in user mode (e.g., during normal operation). Such a mechanism may shorten the configuration time for the integrated circuit, as well as provide the ability to reconfigure the IO and peripheral blocks of the integrated circuit on the fly to reduce or eliminate system down time. With the flexible CSR configuration mechanism, a CSR chain may be partitioned into a group of shift register partial reconfiguration (PR) regions (which will be referred to as PR regions hereafter). A PR region may include a configuration shift register (e.g., a segment of two or more connected register circuits) that is serially-coupled to another configuration shift register in the next PR region in the group. Once the integrated circuit is configured, the flexible configuration mechanism, which will be described in detail below, is put into place to determine whether any of the PR regions is enabled or disabled.

Figure 2:
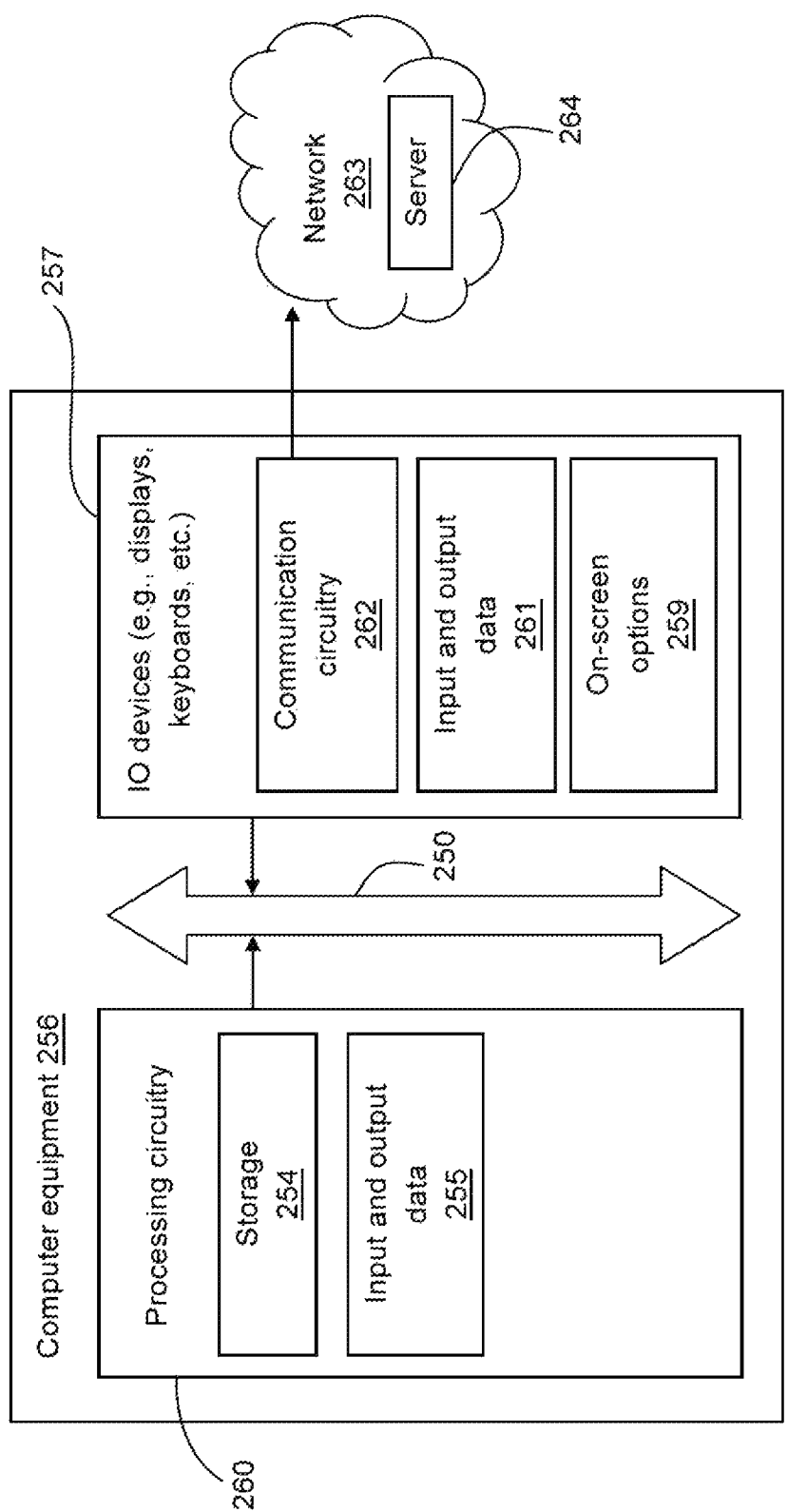
FIG. 2 is a block diagram of an illustrative computer equipment that may be used to implement computer-based software tools in accordance with an embodiment of the present invention.

In a typical design flow, a circuit designer would use electronic design automation (EDA) tool to create a circuit design, and the EDA tool would generate configuration data (e.g., configuration bitstream) that may then be used to configure an integrated circuit. FIG. 2 is an illustrative computer equipment that can be used for this purpose. As shown in FIG. 2, computer equipment 256 may include processing circuitry 260. Computer equipment 256 may be based on one or more processors such as personal computers, workstations, etc. Processing circuitry 260 may include circuitry for performing various supported instructions. Storage 254 in processing circuitry 260 may be organized to form shared and stand-alone databases. The stored information in the storage 254 may include input and output data 255. For example, input data may include settings selected by a user or a software library. Output data may include modeling results, configuration data, reports and any other suitable processed output from computer equipment 256.

In supporting design operations involved in implementing a desired custom logic function, computer equipment 256 may use software that runs on processing circuitry 260. This software may take the form of one or more programs. For example, the software is an EDA tool. When the programs are running on computer equipment 256, computer equipment 256 is sometimes referred to as a computer-aided design tool (or tools).

Input and output devices 257 may include input devices such as pointing devices and keyboards and may include output devices such as printers and displays. As shown in FIG. 2, computer equipment 256 may display on-screen options 259 on a display. The user may click on these on-screen options or may otherwise make selections based on the displayed information. The user may also provide input by typing into text boxes, by performing drag and drop operations, using tabs, etc. Input and output data 261 may include input data (e.g., data that a user has typed into a text-box or has selected using a drop-down menu or other selectable options) and output data (e.g., modeling results, reports, information indicative of design choices, etc.). Input and output data 261 may be displayed on a display or printed for the user.

Communication circuitry 262 may facilitate data and information exchange between various circuits of computer equipment 256 through bus interface circuitry 250. As an example, communication circuitry 262 may provide various protocol functionality (e.g., Transmission Control Protocol/Internet Protocol (TCP/IP) (including the physical layer, or PHY), User Datagram Protocol (UDP) etc.), as desired. As another example, communication circuitry 262 may communicate with network 263 (e.g., Ethernet, token ring, etc.). Network 263 may include one or more servers 264 that store data and information. During integrated circuit testing, communication circuitry 262 may be configured to store performance results of each tested integrated circuit on server 264. If desired, communication circuitry 262 may be used to send and receive data such as the performance results from server 264 over network 263.

Figure 3:
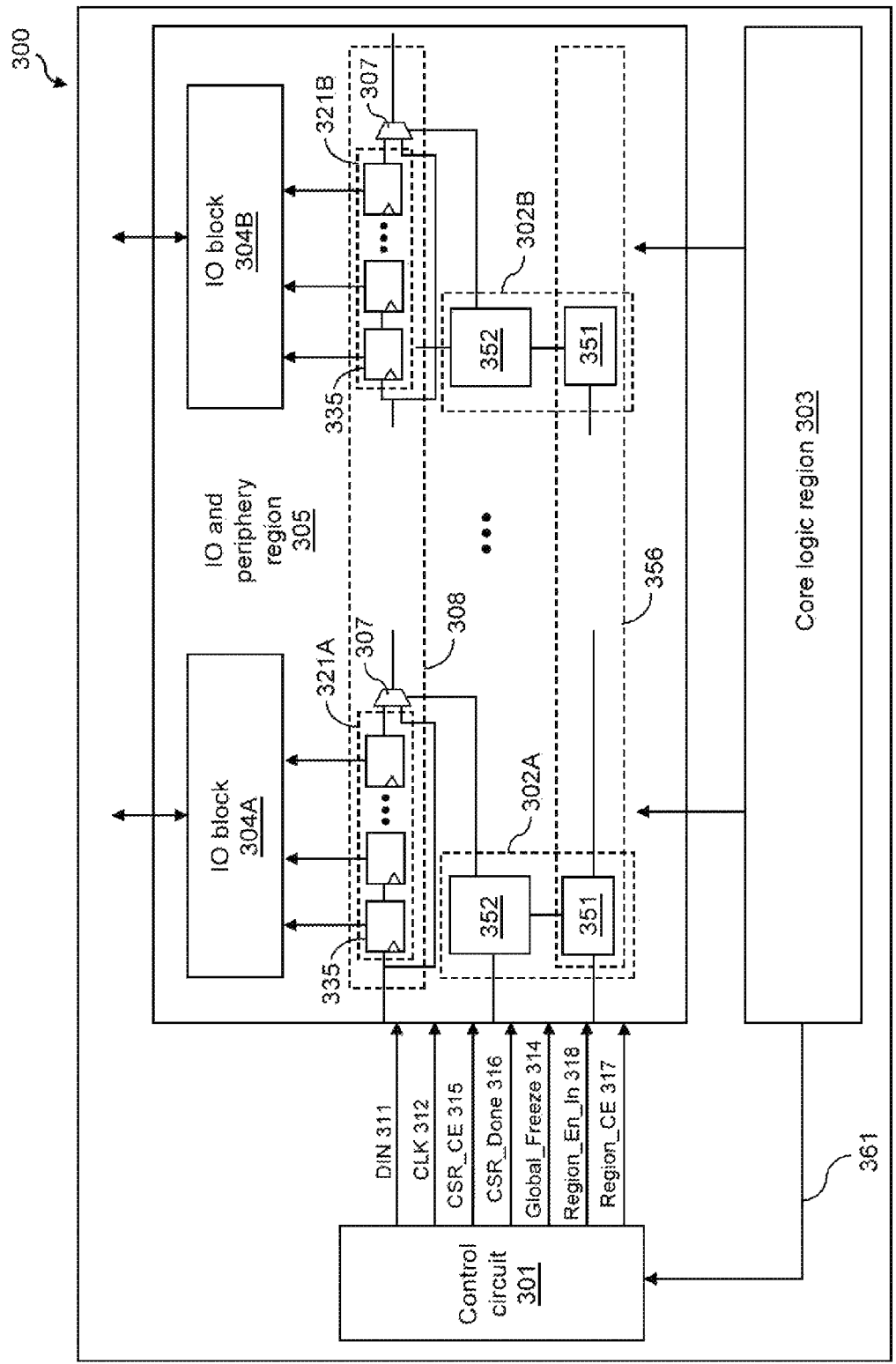
FIG. 3 is an illustrative integrated circuit having a configuration shift register chain in accordance with an embodiment of the present invention.

FIG. 3 is an illustrative integrated circuit 300 having a configuration shift register (CSR) chain 308, in accordance with an embodiment of the present invention. Integrated circuit 300 includes core logic region 303 and CSR chain 308. CSR chain 308 may include of one or more CSRs, with each CSR containing a group of serially-coupled configuration registers 335. As shown in FIG. 3, CSR chain 308 is coupled to a group of input-output (IO) circuits (e.g., IO blocks 304A and 304B) that is formed within IO and periphery region 305 of integrated circuit 300. CSR chain 308 is configured to control IO blocks 304A and 304B to carry out IO and peripheral functions (or operations).

In one embodiment, CSR chain 308 may be fully or partially configured (or reconfigured) in a device configuration phase or in user mode. To do so, CSR chain 308 may be partitioned (or segmented) into a predetermined number of CSR partial reconfiguration regions (which may be referred to as PR regions herein) for individual PR region enabling. For example, CSR chain 308 may be partitioned into two PR regions 321A and 321B. A multiplexer (e.g., multiplexer 307) is added to the end of each PR region so as to allow one PR region (e.g., PR region 321A) to be connected to the next PR region (e.g., PR region 321B), or to be skipped. In one embodiment, each of the partitioned PR regions (e.g., PR regions 321A and 321B) may be coupled to a partial reconfiguration (PR) circuit for individual PR region configuration. For example, PR region 321A is coupled to PR circuit 302A, and PR region 321B is coupled to PR circuit 302B. In one embodiment, a PR circuit may include region enable circuitry 351 and region control circuitry 352. As shown in FIG. 3, region enable circuitry 351 is arranged in parallel with CSR chain 308. Region enable circuitry 351 is added to the PR region serial connection path to form an enable shift register (ESR) chain 356 for each individual PR region enabling. A more detailed description of PR region 321A and PR circuit 302A are provided later with reference to FIG. 4.

In one embodiment, PR circuits 302A and 302B may form a flexible CSR configuration mechanism that supports both full and partial CSR configurations in both device configuration (or reconfiguration) phase and user mode through a general configuration controller (e.g., control circuit 301). External configuration data (bitstream) may be provided to control circuit 301 in integrated circuit 300 through a programming means, which is not shown in FIG. 3. Configuration signals (e.g., input CSR signal DIN 311, clock signal CLK 312, CSR clock enable signal CSR_CE 315, CSR done signal CSR_Done 316, global freeze signal Global_Freeze 314, PR circuit enable data signal Region_En_In 318, PR circuit clock enable signal Region_CE 317) can be generated by control circuit 301. Control circuit 301 can also receive the configuration signals from core logic region 303 via control path 361 to allow the configuration (or reconfiguration) of CSR chain 308 to be driven by core logic region 303.

By way of example, the flexible CSR configuration mechanism may be configured to support both full and partial CSR configuration in both device configuration (or reconfiguration) phase and user mode in the following manner. First, Global_Freeze 314 is asserted to globally isolate IO blocks 304A and 304B (each under the control of CSR 308) from core logic region 303. It should be noted that this step only occurs in a full CSR configuration or reconfiguration operation. When Region_CE 317 is asserted, CLK 312 is enabled and Region_En_In 318 is shifted in to enable PR regions 321A and 321B. This step defines the actual CSR chain for the CSR configuration (or reconfiguration), and enables PR regions 321A and 321B to be configured. Once the shifting operation is completed, Region_CE 317 is deasserted to apply the shifted Region_En_In 318 to region control circuitry 352 of each PR circuit 302A and 302B. In this scenario, each of PR regions 321A and 321B may be locally frozen (e.g., isolated) by region control circuitry 352 to facilitate the CSR configuration.

During the CSR configuration, CSR_Done 316 is deasserted to indicate the start of the CSR configuration. When CSR_CE 315 is asserted, CLK 312 is enabled and configuration data DIN 311 is shifted in. This step drives the configuration data into the defined (or enabled) PR regions 321A and 321B. Once the shifting operation is completed, CSR_CE 315 is deasserted and CSR_Done 316 is asserted to apply the shifted DIN 311 to IO blocks 304A and 304B to be controlled. To release the previously enabled PR regions 321A and 321B from local freeze, Region_CE 317 is asserted to enable CLK 312 and shift in Region_En_In 318 to disable PR regions 321A and 321B. Once the shifting operation is completed, Region_CE 317 is deasserted to apply the shifted Region_En_In 318 to PR regions 321A and 321B to release them from local freeze. Subsequently, Global_Freeze 314 is deasserted to release IO blocks 304A and 304B from being controlled by the CSR configuration. It should be noted that this step may only occur after the full CSR configuration or reconfiguration operation is done.

Figure 4:
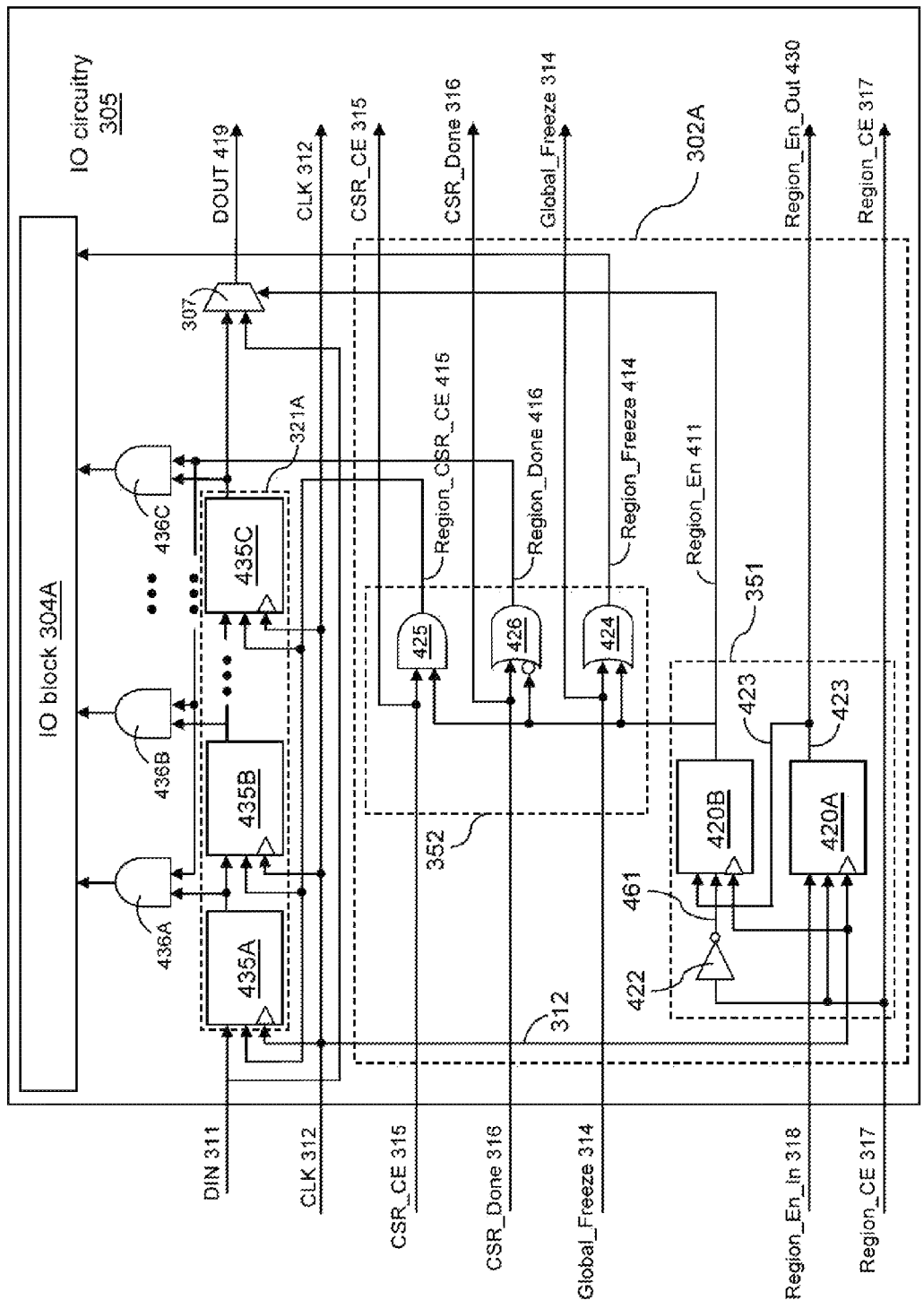
FIG. 4 is an illustrated circuit diagram of a partial reconfiguration circuit coupled to a partial reconfiguration region in accordance with an embodiment of the present invention.

FIG. 4 shows an illustrative circuit diagram of one embodiment of PR circuit 302A coupled to PR region 321A. As described above, PR circuit 302A may include region enable circuitry 351 and region control circuitry 352. In an exemplary embodiment, region enable circuitry 351 may include an enable register (e.g., enable register 420A) having an output coupled to a shadow enable register (e.g., shadow enable register 420B). These enable registers of PR region 321A are serially connected to enable registers of a next PR region to form an enable shift register (ESR) chain (e.g., ESR chain 356 of FIG. 3), which may be driven by control circuit 301 of FIG. 3 with a separate clock enable signal, Region_CE 317.

In one embodiment, region enable circuitry 351 may receive ESR data (also referred to as PR circuit enable data) such as Region_En_In 318 as an input and selectively enable reconfiguration of PR region 321A, based on the ESR data. For example, when Region_CE 317 is asserted, clock signal CLK 312 is enabled and enable register 420A of region enable circuitry 351 is supplied with Region_En_In 318 that enables the reconfiguration of PR region 321A. In this configuration, Region_En_In 318 may shift out of enable register 420A as region enable circuitry output 423. In one embodiment, region enable circuitry output 423 may be transmitted out as input PR circuit enable data for the next PR region (e.g., PR region 321B of FIG. 3) for the same purpose of enabling the reconfiguration of the next PR region. A copy of region enable circuitry output 423 is transferred to shadow enable register 420B so that only the configuration data associated with PR region 321A is stored. The shift operation of shadow enable register 420B is clocked by CLK 312 and an active high control signal (e.g., control signal 461) that produced by inverter 422 when Region_CE 317 is deasserted. As a result, a region enable circuitry output (e.g., Region_En 411) is shifted out of shadow enable register 420B in synchronization with CLK 312.

The resulting Region_En 411 is supplied to region control circuitry 352. In an exemplary embodiment, region control circuitry 352 may include three logic gates (e.g., logic gates 424, 425, and 426). Each logic gate is configured to receive a corresponding global configuration control signal (e.g., Global_Freeze 314, CSR_CE 315, and CSR_Done 316) and Region_En 411 to produce local reconfiguration control signal (e.g., Region_CSR_CE 415, Region_Done 416, and Region_Freeze 414). These local reconfiguration control signals may collectively function to perform region enabling operations that control the configuration operation of PR region 321A. For example, the region enabling operations include, but not limited to, locally freezing (e.g., isolating) PR region 321A from IO block 304A, enabling a shifting operation of the enabled PR region 321A, and controlling multiplexer 307 to select either DIN 311 or a shifted version of DIN 311 from PR region 321A to be transmitted to the next PR region for configuration.

As described above, PR region 321A may be part of a group of connecting CSR partial reconfiguration regions that forms CSR chain 308 of FIG. 3. Referring to FIG. 4, PR region 321A may include multiple configuration registers (e.g., configuration registers 435A, 435B, and 435C) that are connected as a shift register. For example, when PR region 321A is enabled for CSR configuration, CSR data input (e.g., DIN 311) will be loaded onto configuration registers 435A, 435B, and 435C. In one embodiment, configuration registers 435A, 435B, and 435C are clocked by Region_CSR_CE 415 and CLK 312 and provide shifted data bit outputs to the corresponding logic gates (e.g., logic gate 436A, 436B and 436C). These logic gates are controlled by Region_Done 416 to configure IO block 304A.

Once the shifting operation is complete, a shifted data output of DIN 311 is provided to an input of multiplexer circuit 307. The other input of multiplexer circuit 307 is driven by DIN 311. The select input of multiplexer circuit 307 is controlled by Region_En 411 of region enable circuit 351. In one embodiment, multiplexer circuit 307 may operatively couple to PR region 321A to allow the output of PR region 321A to be transmitted to the next PR region as an input data signal. In another embodiment, multiplexer circuit 307 may operatively couple to PR region 321A to allow DIN 311 to bypass (e.g., skip) PR region 321A when PR region 321A is disabled from CSR configuration. For example, when PR region 321A is enabled, multiplexer circuit 307 may select the shifted data output of DIN 311 based on Region_En 411. In another example, when PR region 321A is disabled, multiplexer circuit 307 may select DIN 311 instead.

In one embodiment, PR circuit 302A and PR region 321A may collectively form a flexible CSR configuration mechanism that facilitates IO configuration. Such a mechanism can be used to implement different CSR configurations (e.g., full CSR configuration (or reconfiguration), initial partial CSR configuration, and partial CSR reconfiguration). In an exemplary embodiment shown in FIG. 4, during a device configuration (or reconfiguration) phase, PR region 321A and all other PR regions (e.g., PR region 321B) in the same CSR chain (e.g., CSR chain 308 of FIG. 3), are enabled to perform the full CSR configuration (or reconfiguration) operation. To do so, a global freeze signal (e.g., Global_Freeze 314) is asserted (e.g., via control circuit 301 of FIG. 3) to globally isolate all the PR regions in the CSR chain. Following that, PR circuit enable data (e.g., Region_En_In 318) is shifted into the integrated circuit through region enable circuitry 351 to enable the configuration (or reconfiguration) of all the PR regions. An output (e.g., Region_En 411) from region enable circuitry 351 will be generated and applied to region control circuitry 352 to generate the corresponding local configuration (or reconfiguration) control signals (e.g., Region_CSR_CE 415, Region_Done 416, and Region_Freeze 414) to configure the PR regions. Once the configuration operation is complete, the ESR data is shifted into the integrated circuit again to disable the PR regions.

The initial partial CSR configuration may have similar circuit operations with the full CSR configuration with the exception that the initial partial CSR configuration enables the initial functionality of specific PR regions of the integrated circuit. In an exemplary embodiment shown in FIG. 4, during a device configuration phase, the specific PR regions (e.g., PR region 321A) may be enabled to perform the initial partial CSR configuration operation. Other PR regions (e.g., PR region 321B) in CSR chain 308 will be disabled (e.g., not configured). In other words, the flexible CSR mechanism in each of the disabled PR regions will not be activated for individual PR region enabling. To do so, global freeze signal (e.g., Global_Freeze 314) is asserted (e.g., via control circuit 301 of FIG. 3) to globally isolate all the PR regions in the CSR chain from a core logic region (e.g., core logic region 303 of FIG. 3) of the integrated circuit. Following that, Region_En_In 318 is shifted into the integrated circuit through region enable circuitry 351 to enable only the configuration of the enabled PR region 321A. An output (e.g., Region_En 411) from region enable circuitry 351 will be generated and applied to region control circuitry 352 to generate the corresponding local configuration control signals (e.g., Region_CSR_CE 415, Region_Done 416, and Region_Freeze 414) to configure the PR region 321A. Once the configuration operation is complete, the ESR data is shifted into the integrated circuit again to disable the enabled PR region 321A.

Partial CSR reconfiguration can be initiated to achieve IO reconfiguration in the integrated circuit during user mode. A user (e.g., a logic designer) may provide new configuration data, which will be described in detailed in FIGS. 5 and 6, that defines one or more PR regions to be reconfigured during the partial CSR reconfiguration operation. In this scenario, only the PR regions defined in the new configuration data will be locally "frozen" (e.g., logically isolated) based on Region_Freeze 414 and hence, allowing these defined PR regions to be reconfigured with the new configuration data. Accordingly, the disabled PR regions will be skipped (e.g., not configured), without affecting the operations of the disabled PR circuits. Generally, the IO reconfiguration can be achieved by shifting the new configuration data into PR region 321A based on CLK 312 such that a shifted configuration data signal is produced. The shifted configuration data signal may be transmitted to the corresponding IO block (controlled by the defined PR region) to be reconfigured.

During CSR configuration, a selected output data signal (e.g., DOUT 419) of each PR region may be transmitted to the next PR region of the integrated circuit (e.g., using multiplexer circuit 307) to facilitate the PR region enabling operations of the next PR region. Accordingly, the global configuration control signals, CLK 312, and ESR control signals (e.g., Region_En Out 430 and Region_CE 317) are also transmitted to the next PR region for the same purpose.

Figure 5:
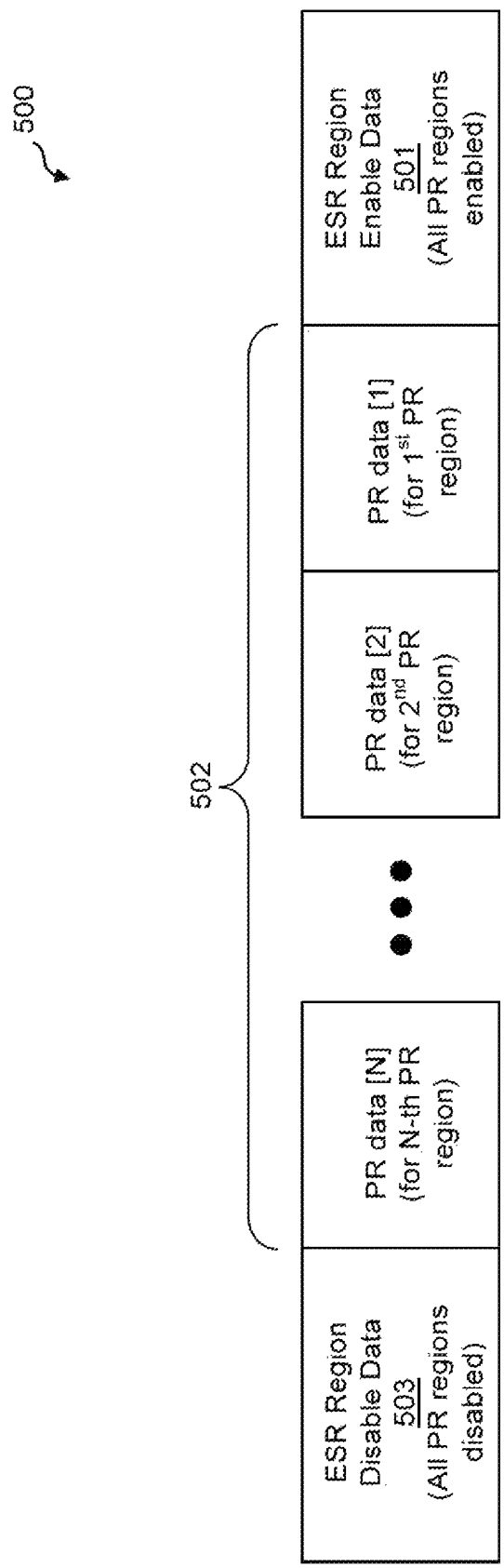
FIG. 5 shows illustrative bitstream format for a configuration bitstream that can be loaded into a programmable integrated circuit in accordance with an embodiment of the present invention.

FIG. 5 shows an illustrative bitstream format of configuration bitstream 500 for the IO and peripheral CSR of an integrated circuit in accordance with an embodiment of the present invention. Generally, integrated circuits (e.g., integrated circuit 300 of FIG. 3) are configured by receiving data from an electronic design automation tool. This data may be referred to as a configuration bitstream, which may be included in a program object file (POF). The configuration bitstream may be loaded into the configuration memory cells (e.g., memory elements 20 of FIG. 1) of the integrated circuit. The configuration of the integrated circuit is driven by the configuration bitstream from a configuration controller (e.g., control circuit 301 of FIG. 3).

Depending on user design requirements, the format and the content of the CSR configuration bitstream may be defined to implement different types of configuration shift register (CSR) configurations on a single integrated circuit. For example, as shown in FIG. 5, the format of configuration bitstream 500 for a full CSR configuration or a partial initial CSR configuration may begin with a PR region enable data section (e.g., PR region enable data 501) that defines (e.g., enables) one or more (an N number of) CSR partial reconfiguration regions (may be referred to as PR regions herein) in a CSR chain (e.g., CSR chain 308 of FIG. 3) to be configured.

It is then followed by a PR data section (e.g., PR data section 502) that includes PR data portions for configuring the defined PR regions. For example, PR data[1] may configure the first CSR PR region (e.g., PR region 321A) in the CSR chain, PR data[2] may configure the second PR region (e.g., PR region 321B) in the CSR chain, and PR data[N] may configure the N-th PR region in the CSR chain.

Lastly, configuration bitstream 500 is concluded by an ending PR region disable data section (e.g., PR region disable data 503) to disable all the defined PR regions. In one embodiment, PR region enable data 501 and PR region disable data 503 may be part of a CSR PR circuit enable data (e.g., Region_En_In 318 of FIG. 3) that is supplied to the integrated circuit to facilitate individual CSR PR region enabling.

Figure 6:
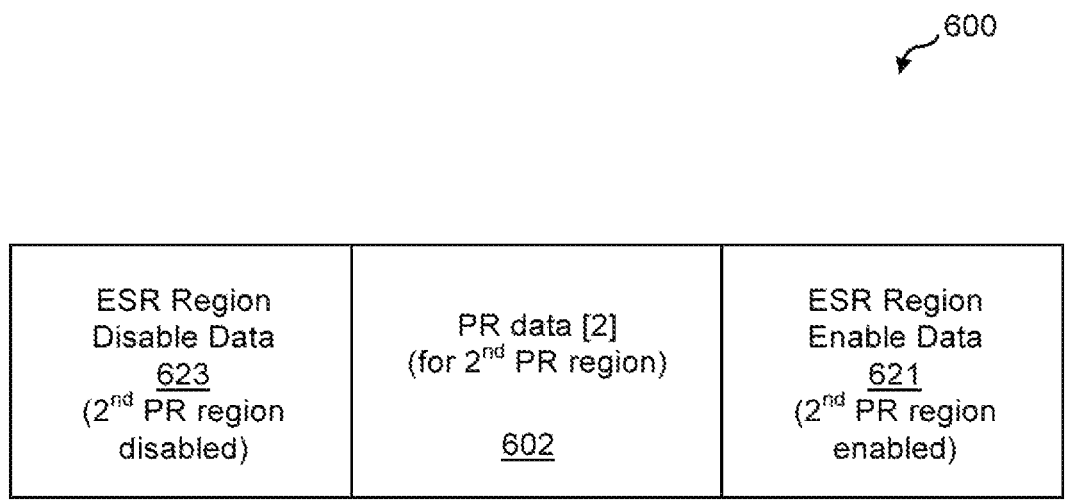
FIG. 6 shows another illustrative configuration bitstream format in accordance with an embodiment of the present invention.

In some cases, specific CSR partial reconfiguration regions (which may be referred to as PR regions herein) may be enabled for partial CSR configuration (or reconfiguration) to facilitate IO configuration of an integrated circuit. FIG. 6 is an illustrative bitstream format of configuration bitstream 600 for the integrated circuit, in accordance with an embodiment of the present invention. It should be appreciated that FIGS. 3 and 6 may be used as examples to illustrate the following description.

In one embodiment, only configuration data portions of the enabled PR regions may be included in configuration bitstream 600. As an example, in FIG. 3, CSR PR region 321B (will be referred to as PR region herein) may be enabled and PR region 321A may be disabled prior to performing either initial partial CSR configuration or partial CSR reconfiguration in integrated circuit 300. In this scenario, the configuration data portion for first PR region (e.g., PR region 321A) in CSR chain 308 is not included in the configuration bitstream 600, which means that the configuration of PR region 321A will be skipped (e.g., not configured) during the partial CSR configuration operation.

Similar to configuration bitstream 500 of FIG. 5, the format of configuration bitstream 600 for the initial partial CSR configuration or partial CSR reconfiguration may begin with a CSR PR region enable data section, followed by a PR data section, and concluded with an ending PR disable section. In one embodiment, the data sections of configuration bitstream 600 may only contain information that enables the CSR configuration of the second PR region (e.g., PR region 321B). For example, PR region enable data 621 may include data bits that enable only the second PR region, PR data section 602 may include data bits that configures the second PR region, and PR region disable data 623 may include data bits that disables the second PR region after the operation of the partial CSR configuration or partial CSR reconfiguration is completed.

Figure 7:
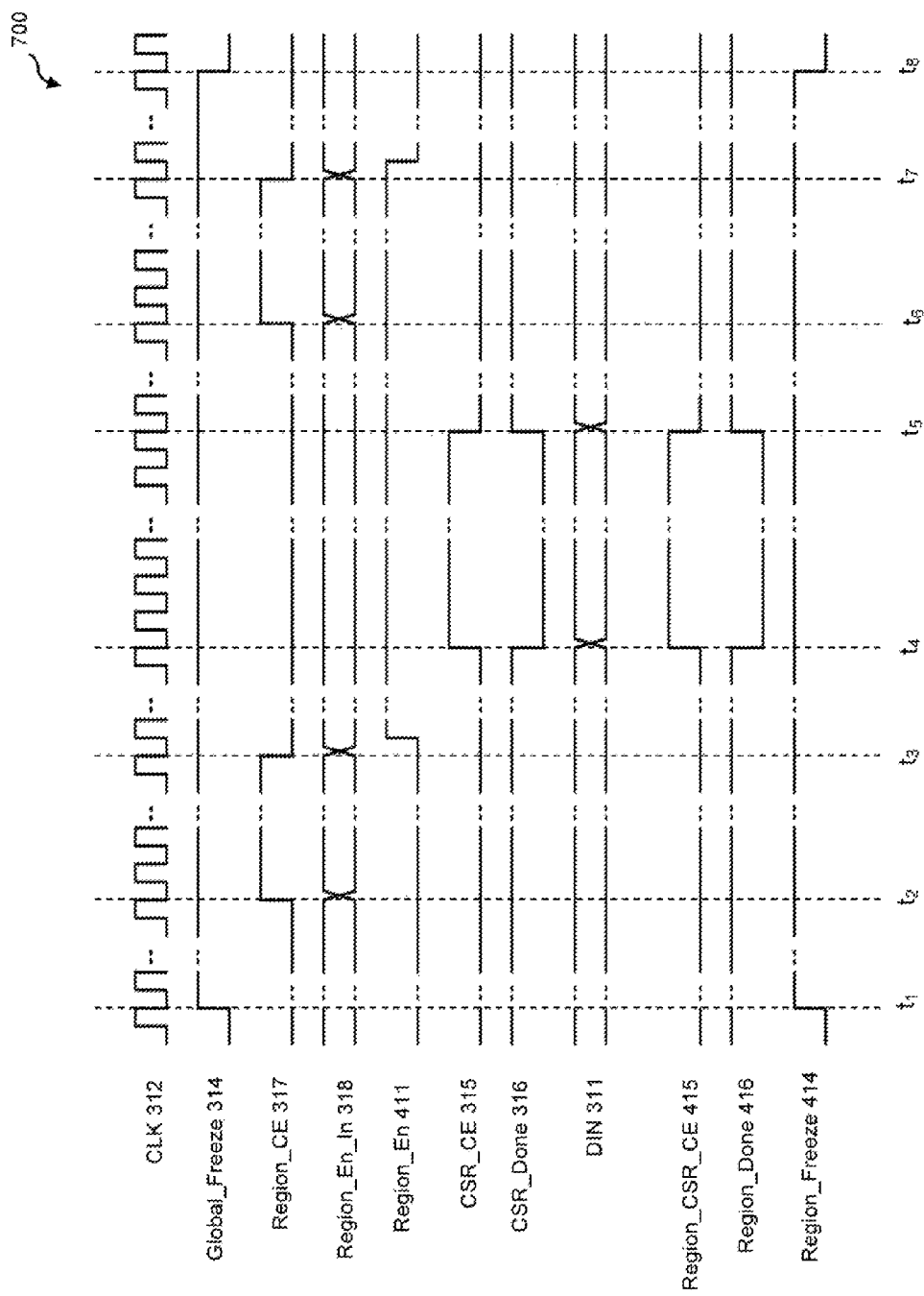
FIG. 7 is an illustrative timing diagram showing the outputs of full and initial partial configuration shift register (CSR) configurations of a partial reconfiguration circuit in accordance with an embodiment of the present invention.

FIG. 7 is an illustrative timing diagram 700 showing the outputs of full and initial partial CSR configuration of enabled PR regions 321A and 321B of integrated circuit 300 of FIG. 3, in accordance with an embodiment of the present invention. It should be appreciated that the full CSR configuration (or reconfiguration) and initial partial CSR configuration may share the same flow of operation and therefore, the timing diagram for both circuit operations may be share similarities with each other.

In one embodiment, the IO configuration of an integrated circuit (e.g., integrated circuit 300 of FIG. 3) is controlled by configuration data bits of a configuration bitstream provided to the device for that purpose. In this example, a set of global configuration global signals may be provided to IO and periphery region 305 (by control circuit 301 of FIG. 3) based on configuration bitstream 500 of FIG. 5. The set of signals, as shown in timing diagram 700, may include a global freeze signal (e.g., Global_Freeze 314), a PR circuit clock enable signal (e.g., Region_CE 317), a PR circuit enable data signal (e.g., Region_En_In 318), a CSR clock enable signal (e.g., CSR_CE 315), a CSR done signal (e.g., CSR_Done 316), and a CSR data input signal (e.g., DIN 311). Region enable circuitry 351 and region control circuitry 352 of FIG. 3 may generate a set of local region control signal, as shown in timing diagram 700, including a PR circuit enable control signal (e.g., Region_En 411), a region clock enable control signal (e.g., Region_CSR_CE 415), a region done control signal (e.g. Region_Done 416), and a region freeze control signal (e.g. Region_Freeze 414). Accordingly, a clock signal (e.g., CLK 312) from control circuit 301 of FIG. 3 may be used to synchronize all the circuit operations in PR regions 321A and 321B of CSR chain 308. It should be appreciated that all of the global signals from control circuit 301 may change on the falling (or negative) edges of CLK 312 and all the registers in IO circuitry 305 may be latched by the rising (or positive) edges of CLK 312 to avoid potential timing conflicts.

When integrated circuit 300 is powered up, the elements within PR regions 321A and 321B in CSR chain 308 of FIG. 3 may reset to their respective initial states. For example, the binary values of Global_Freeze 314, Region_CE 317, Region_En 411, and CSR_CE 315, are reset to "0", respectively. Accordingly, the binary value of CSR_Done 316 is reset to "1", respectively. Correspondingly, the binary values of the local generated signals Region_CSR_CE 415, Region_Freeze 414, and Region_Done 416 may be overridden to the binary values of CSR_CE 315 ("0"), Global_Freeze 314 ("0"), and CSR_Done 316 ("1"), respectively.

During the full and initial partial CSR configuration operations, each of PR regions 321A and 321B may perform specific region enabling operations (which have been described previously in FIG. 4) based on data bit information in configuration bitstream 500 of FIG. 5. For example, the region enabling operations performed by PR region 321A and 321B during the time interval between $T_1$ and $T_4$ may be specified by PR circuit enable data 501 of configuration bitstream 500. Accordingly, the region enabling operations performed by PR region 321A and 321B during the time interval between $T_4$ and $T_5$ may be specified by PR data section 502. Lastly, the region enabling operations performed by PR regions 321A and 321B during the time interval between $T_5$ and $T_8$ may be specified by PR region disable data 503 of FIG. 5.

To simplify the following description, only the embodiments of PR region 321A will be used to describe timing diagram 700, even though all other PR regions (e.g., PR region 321B) within the same CSR chain (e.g., CSR chain 308) may be operating simultaneously. At the time interval between $T_1$ to $T_7$, Global_Freeze 314 is asserted (e.g., set to "1") to PR region 321A to globally isolate PR region 321A from core logic region 303 of FIG. 3. In this embodiment, Region_Freeze 414 is overridden by the Global_Freeze 314 and therefore, the phase of Region_Freeze 414 is the same as the phase of Global_Freeze 314.

At the time interval between $T_2$ to $T_3$, enable registers 420A and 420B of region enable circuitry 351 may be clocked by CLK 312 and PR circuit clock enable signal (e.g., Region_CE 317) of FIG. 4. For example, as shown in FIG. 4, enable register 420A may perform sequential bit shifting on enable shift register (ESR) data (e.g., Region_En_In 318) at every rising edge of CLK 312 such that an output data signal (e.g., reference output data 423) is shifted out from enable register 420A.

At the time $T_3$, Region_CE 317 is deasserted (e.g., set to "0") and stay deasserted until time $T_6$. At this stage, the deasserted Region_CE 317 may then be locally inverted by inverter 422 and applied to the clock enable port of shadow enable register 420B. Shadow enable register 420B may receive reference output data 423 from enable register 420A and perform sequential bit shifting on it to produce region enable circuitry output (e.g., Region_En 411). For example, as shown in timing diagram 700, Region_En 411 is asserted once reference output data 423 of FIG. 4 is shifted out from shadow enable register 420B by CLK 312. In one embodiment, region control circuitry 352 may control PR region 321A by sending a control signal (e.g., Region_CSR_CE 415) that is indicative of region enabling operations, based on Region_En 411.

In order to activate a shifting operation in PR region 321A, CSR_CE 315 is asserted and AND-ed together with Region_En 411 at logic gate 425 to become Region_CSR_CE 415. When Region_CSR_En 415 is received by PR region 321A, the use of CLK 312 is enabled by Region_CSR_CE 415 to activate a shifting operation in PR region 321A. In one embodiment, CSR_CE 315 is asserted to ensure that a data bit from DIN 311 is shifted into every one of the configuration registers (e.g., configuration registers 435A, 435B, and 435C) in PR region 321A.

At the time interval between $T_4$ to $T_5$, once the last data bit of DIN 311 is shifted in, each configuration register in PR region 321A produces a shifted data bit output to its corresponding logic gates (e.g., logic gate 436A, 436B and 436C). Accordingly, PR region 321A may also generate a shifted version of DIN 311 as an input to multiplexer circuit 307. In one embodiment, multiplexer circuit 307 of FIG. 4 may be controlled by Region_En 411 to select the shifted data signal output of DIN 311 when PR region 321A is enabled for CSR configuration. Subsequently, the selected shifted data output from multiplexer circuit 307 is transmitted out from PR region 321A as DOUT 419 of FIG. 4.

At time $T_5$, CSR_CE 315 is deasserted to indicate that the shifting operation of DIN 311 in PR region 321A is complete. At this stage, PR region 321A is disabled from shifting to prevent unwanted shifting entry. Accordingly, CSR_Done 316 is asserted at the same time (e.g., time $T_5$) to indicate that the CSR configuration is completed. Region_Done 416 is asserted in response to the assertion of CSR_Done 316 to control logic gates 436A-436C to select the shifted data bit output from their respective configuration register and transmit the selected shifted data bit output to IO block 304A to be configured.

At the time interval between $T_6$ to $T_7$, Region_CE 317 is set to "1" again to enable the use of CLK 312 so that Region_En_In 318 can be shifted through enable registers 420A and 420B.

At the time interval between $T_7$ to $T_8$, Region_CE 317 is deasserted again to apply a shifted output of Region_En_In 318 to PR region 321A. Such a configuration releases the region wide freeze to PR region 321A from logical isolation, in which PR region 321A was enabled previously in order to facilitate the CSR configuration operations. Accordingly, Global_Freeze 314 is deasserted to release IO block 304A from the control of PR region 321A.

Figure 8:
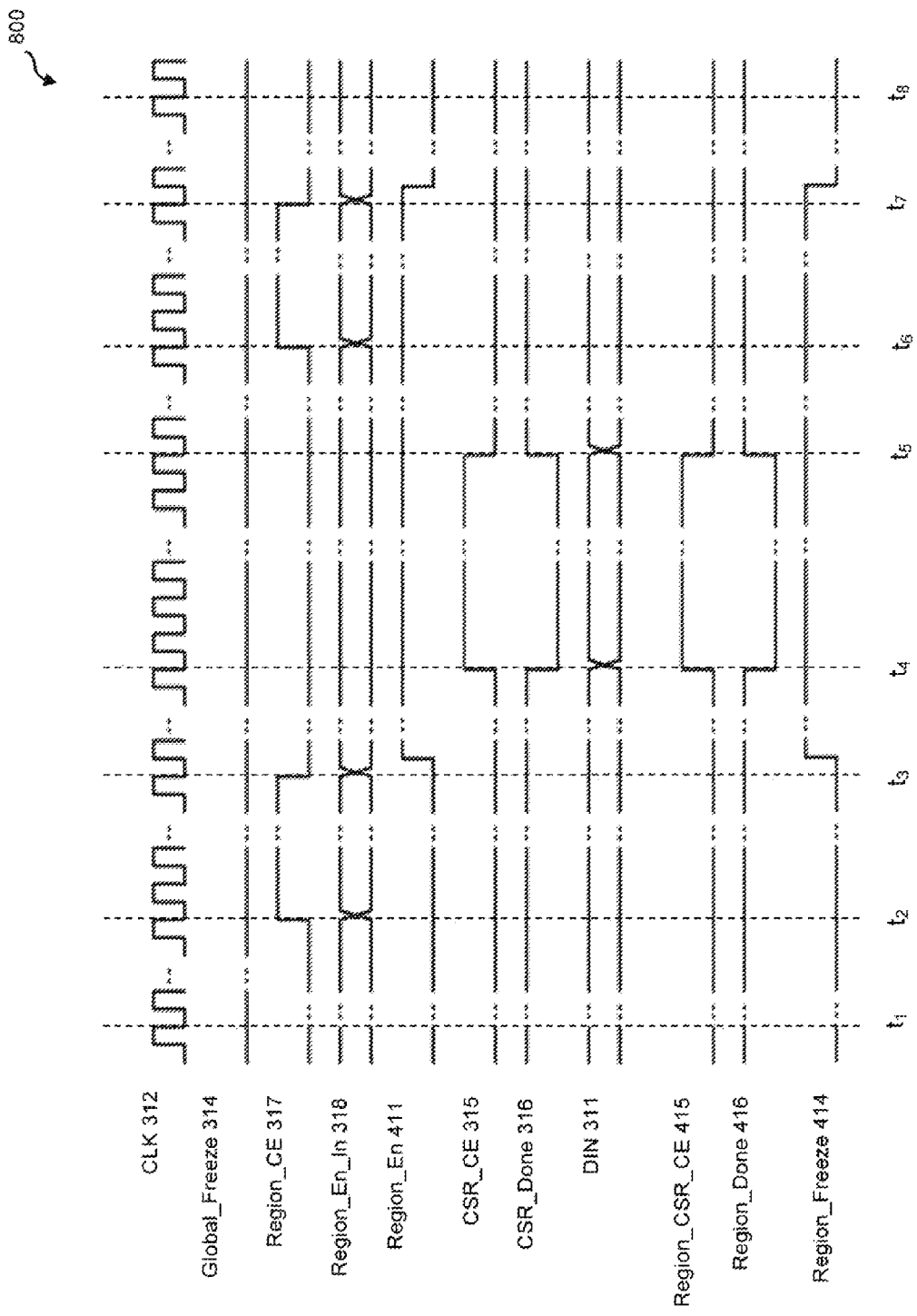
FIG. 8 is an illustrative timing diagram showing the outputs of partial configuration shift register (CSR) reconfiguration of a partial reconfiguration circuit in accordance with an embodiment of the present invention.

FIG. 8 is an illustrative timing diagram 800 showing the outputs of partial CSR reconfiguration of an enabled PR region in an integrated circuit in accordance with an embodiment of the present invention. As mentioned above, the partial CSR reconfiguration can be initiated to achieve IO reconfiguration in the integrated circuit (e.g., integrated circuit 300 of FIG. 3) during user mode. It should be appreciated that FIGS. 3 and 6 may be used as examples to illustrate the following description.

In an exemplary implementation, PR region 321B of FIG. 3 may be enabled and PR region 321A of FIG. 3 may be disabled in order to facilitate the IO reconfiguration during user mode. In this context, integrated circuit 300 may receive a new configuration bitstream (e.g., configuration bitstream 600 of FIG. 6) containing the configuration data portion of PR region 321B that configures PR region 321B.

As shown in timing diagram 800, the signals involved during the circuit operations of the partial CSR reconfiguration is the same as that previously described with respect to FIG. 7, except that the Global_Freeze 314 may always keep low. Therefore, it should be appreciated that for the sake of brevity, the global configuration control signals and the local reconfiguration control signals already shown in timing diagram 700 of FIG. 7 (e.g., clock signal CLK 312, Region_CE 317, Region_En 411, CSR_CE 315, CSR_Done 316, Region_CSR_CE 415, and Region_Done 416) and described above will not be repeated.

As shown in the embodiment of timing diagram 800, due to Global_Freeze 314 may be always low, Region_Freeze 414 now may be overridden by Region_En 411 during region enabling operations of PR region 321B. The assertion and deasssertion of Region_Freeze 414 may depend on Region_En 411 to locally freeze (e.g., isolate) the enabled PR region 321B from core logic region 303 of FIG. 3. When Region_Freeze 414 is asserted (e.g., set to "1") during the time interval between $T_3$ to $T_8$, both PR region 321B and IO block 304B of FIG. 3 are logically isolated from each other. Such a configuration allows PR region 321B to be reconfigured by PR circuit 302B. Accordingly, the new undefined (e.g., disabled) PR region (e.g., PR region 321A) will be skipped, without affecting the operations of existing disabled PR regions, if any. In this scenario, all the disabled PR regions will be gated (e.g., disconnected or disabled) by CSR_Done 316.

Figure 9:
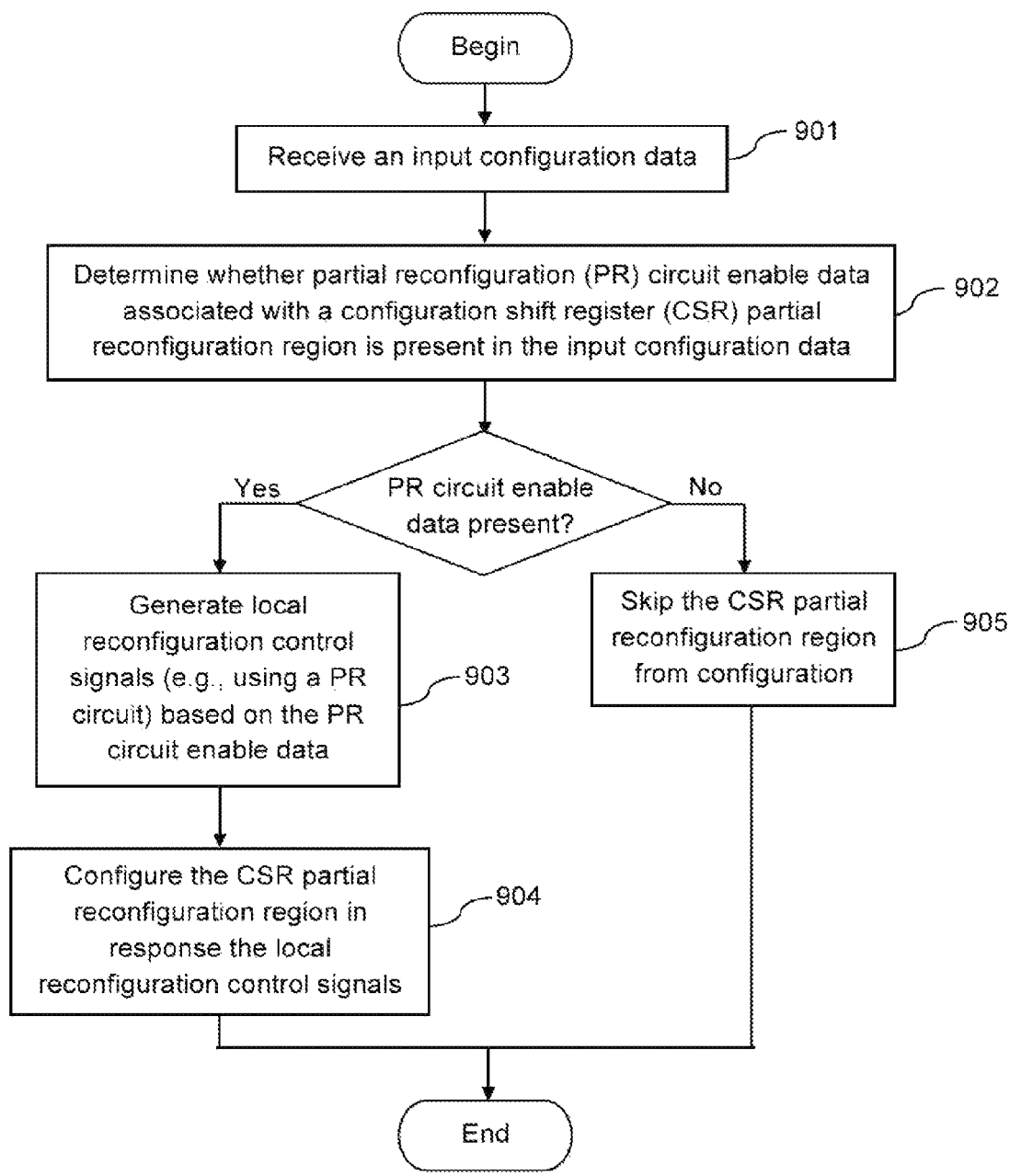
FIG. 9 is a flow chart of illustrative steps for reconfiguring a partial reconfiguration circuit in accordance with an embodiment of the present invention.

FIG. 9 shows a flow chart of illustrative steps for reconfiguring a configuration shift register (CSR) partial reconfiguration region of an integrated circuit in accordance with an embodiment of the present invention. In one embodiment, the steps shown in FIG. 9 may be performed by an electronic design automation (EDA) tool during compilation of the integrated circuit or user design. It should be appreciated that FIGS. 3 and 4 may be used as examples to describe the steps below.

At step 901, an input configuration data is received. The input configuration data may be a configuration bitstream such as configuration bitstream 500 of FIG. 5 and configuration bitstream 600 of FIG. 6. For example, the input configuration data may include CSR data and partial reconfiguration (PR) circuit enable data that facilitate the CSR configuration of the integrated circuit.

At step 902, it is determined whether the PR circuit enable data associated with a configuration shift register PR region is present in the input configuration data. In one embodiment, the configuration shift register PR region, or simply PR region, may be connected to a PR circuit that facilitates the CSR configuration of the PR region. Referring to FIG. 3, the PR circuit (PR circuits 302A and 302B) may include two components, namely region enable circuitry (e.g., region enable circuitry 351) and region control circuitry (e.g., region enable circuitry 352). The region enable circuitry enables the configuration of the PR region, and the region control circuitry controls the configuration of the PR region.

If PR region enable data is present in the input configuration data, local reconfiguration control signals are generated based on the PR circuit enable data are generated at step 903. In an exemplary embodiment shown in FIG. 4, when Region_En 411 is asserted by region enable circuitry 351 to region control circuitry 352, region control circuitry 352 of PR circuit 302A may generate a set of local reconfiguration control signals (e.g., Region_CSR_CE 415, Region_Done 416, Region_Freeze 414) to activate and facilitate the configuration operations of PR region 321A at step 904.

In another embodiment, if the PR region enable signal is not present in the input configuration, it means that the PR region is disabled from being configured and will be skipped at step 905. For example, the CSR data (e.g., DIN 311 of FIG. 3) of the input configuration data will bypass the disabled PR region through a multiplexer circuit (e.g., multiplexer circuit 307 of FIG. 3) without being written into the PR region. The CSR data is subsequently transmitted to the next PR region (e.g., PR region 321B of FIG. 3) for the same purpose of enabling the reconfiguration of the next PR region.

The methods and apparatus described herein may be incorporated into any suitable circuit. For example, the methods and apparatus may be incorporated into numerous types of devices such as microprocessors or other integrated circuits. Exemplary integrated circuits include programmable array logic (PAL), programmable logic arrays (PLAs), field programmable logic arrays (FPGAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The programmable logic device described herein may be part of a data processing system that includes one or more of the following components; a processor; memory; IO circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention.

What is claimed is:

1. An integrated circuit, comprising:
   a configuration shift register that includes a first partial reconfiguration region, a second partial reconfiguration region, a first multiplexer that receives signals from the first partial reconfiguration region, and a second multiplexer that receives signals from the second partial reconfiguration region;
   a first partial reconfiguration circuit that selectively enables the first partial reconfiguration region, wherein the first multiplexer is configured to selectively bypass the first partial reconfiguration region; and
   a second partial reconfiguration circuit that selectively enables the second partial reconfiguration region, wherein the second multiplexer is configured to selectively bypass the second partial reconfiguration region.

2. The integrated circuit of claim 1, wherein the first multiplexer is controlled by the first partial reconfiguration circuit, and wherein the second multiplexer is controlled by the second partial reconfiguration circuit.

3. The integrated circuit of claim 1, wherein the first partial reconfiguration circuit includes a region control circuit.

4. The integrated circuit of claim 3, wherein the region control circuit includes a plurality of logic gates that receives global configuration control signals.

5. The integrated circuit of claim 4, further comprising:
an input-output block, wherein the first partial reconfiguration region receives signals from the plurality of logic gates, and wherein the input-output block receives signals from both the first partial reconfiguration region and the plurality of logic gates.

6. The integrated circuit of claim 3, wherein the first partial reconfiguration circuit further includes a region enable circuit that outputs signal to the region control circuit.

7. The integrated circuit of claim 6, wherein the region enable circuit includes an enable register and a shadow enable register that receives signals from the enable register.

8. The integrated circuit of claim 6, wherein the region enable circuit receives partial reconfiguration region enable control signals.

9. The integrated circuit of claim 1, wherein the first multiplexer is coupled between the first partial reconfiguration region and the second partial reconfiguration region.

10. A method of operating an integrated circuit that includes a configuration shift register, core logic circuitry, and input-output blocks the method comprising:
with a region control circuit, receiving global reconfiguration control signals and generating corresponding local reconfiguration control signals, wherein receiving the global reconfiguration control signals comprises receiving a global freeze signal that, when asserted, isolates the core logic circuitry from the input-output blocks; and
receiving the local reconfiguration control signals at the configuration shift register.

11. The method of claim 10, wherein the global freeze signal is only asserted during a full configuration shift register configuration operation that reconfigures the entire configuration shift register.

12. The method of claim 10, wherein receiving the global reconfiguration control signals comprises receiving a done signal that indicates when reconfiguration of the configuration shift register is complete.

13. The method of claim 10, wherein receiving the global reconfiguration control signals comprises receiving a clock enable signal that, when asserted, allows data to be shifted into the configuration shift register.

14. A method of operating an integrated circuit that includes a configuration shift register, comprising:
with a partial reconfiguration circuit, receiving an asserted global freeze control signal; and
in response to receiving the asserted global freeze control signal, asserting a corresponding local freeze control signal to an input-output block coupled to the configuration shift register.

15. The method of claim 14, further comprising:
performing a partial reconfiguration operation on a partial reconfiguration region that is controlled by the partial reconfiguration circuit while the global freeze control signal is deasserted.

16. The method of claim 14, further comprising:
with a region enable register in the partial reconfiguration circuit, simultaneously receiving an asserted clock enable signal and an asserted enable data signal.

17. The method of claim 16, further comprising:
with the region enable register, generating a region enable output signal; and
latching the region enable output signal at a shadow enable register that is connected in series with the region enable register.

18. The method of claim 17, further comprising:
asserting the local freeze control signal in response to determining that the shadow enable register has latched an asserted signal.

* * * * *